(12) United States Patent
Fukutomi et al.

(10) Patent No.: US 6,752,543 B2
(45) Date of Patent: Jun. 22, 2004

(54) SUBSTRATE PROCESSING APPARATUS

(75) Inventors: Yoshiteru Fukutomi, Kyoto (JP);
Katsushi Yoshioka, Kyoto (JP);
Yukihiko Inagaki, Kyoto (JP)

(73) Assignee: Dainippon Screen Mfg. Co. Ltd. (JP)

( * ) Notice: Subject to any disclaimer, the term of this patent is extended or adjusted under 35 U.S.C. 154(b) by 0 days.

(21) Appl. No.: 10/427,049

(22) Filed: Apr. 30, 2003

(65) Prior Publication Data

US 2003/0217695 A1 Nov. 27, 2003

(30) Foreign Application Priority Data

May 23, 2002 (JP) .................................... P2002-149347

(51) Int. Cl.⁷ ................................................ G03D 5/00
(52) U.S. Cl. ........................ 396/571; 396/578; 396/611; 34/284; 414/416
(58) Field of Search ................................ 396/571, 578, 396/611; 118/52, 319, 320, 321; 414/225, 416, 935; 34/446

(56) References Cited

U.S. PATENT DOCUMENTS 5,937,223 A * 8/1999 Akimoto et al. ............ 396/611

FOREIGN PATENT DOCUMENTS

| JP | 4-139345 | 5/1992 |
| JP | 9-445611 | 2/1997 |
| JP | 10-154644 | 9/1998 |

OTHER PUBLICATIONS

English translation of Abstract for Japanese Patent Application Laid Open No. JP–10–154644.
English translation of Abstract for Japanese Patent Application Laid Open No. JP–4–139345
English translation of Abstract for Japanese Patent Application Laid Open No. JP–9–445611.

* cited by examiner

*Primary Examiner*—D. Rutledge
(74) *Attorney, Agent, or Firm*—Ostrolenk, Faber, Gerb & Soffen, LLP

(57) ABSTRACT

A manifold communicatively connects a plurality of coating processing units with an air conditioning unit. The manifold is formed by branching a common pipe into a plurality of distributing pipes. The air conditioning unit performs temperature control to set air passing through a branch point of the manifold to a temperature slightly lower than a target temperature in processing units. Secondary heaters secondarily heat air passing through joints between the distributing pipes and the processing units to the target temperature thereby supplying accurately temperature-controlled air to processing parts. Air from the air conditioning unit is diverted thereby suppressing the height of the overall apparatus. Thus, a substrate processing apparatus capable of inhibiting the height of the overall apparatus from remarkable increase also when vertically stacking processing parts in multiple stages and supplying temperature-controlled air to the processing parts with sufficient accuracy.

8 Claims, 6 Drawing Sheets

SUBSTRATE PROCESSING APPARATUS

BACKGROUND OF THE INVENTION

1. Field of the Invention

The present invention relates to a substrate processing apparatus comprising a plurality of processing parts processing a semiconductor substrate, a glass substrate for a liquid crystal display, a glass substrate for a photomask or a substrate for an optical disk (hereinafter referred to as "substrate") and supplying temperature-controlled air thereto.

2. Description of the Background Art

As well known in the art, a product such as a semiconductor device or a liquid crystal display is manufactured by performing a series of processing such as cleaning, resist coating, exposure, development, etching, formation of an interlayer dielectric film, thermal processing and dicing on the aforementioned substrate. A substrate processing apparatus including a plurality of processing units performing resist coating processing, development processing and subsequent thermal processing, for example, for circularly transporting a substrate between the processing units by a transport robot thereby performing a series of photolithographic processing on the substrate is widely employed as the so-called coater & developer.

Such a substrate processing apparatus removes fine particles through an ULPA filter, for example, while removing a chemical substance such as ammonia through a chemisorption filter for supplying clean air to the peripheries of the processing units and the transport robot and maintaining the same in a clean atmosphere. In particular, the substrate processing apparatus supplies air controlled in temperature and humidity to the coating processing unit coating the substrate with resist since the temperature and the humidity of the atmosphere influence the thickness of the formed resist film.

In general, the substrate processing apparatus supplies the clean air controlled in temperature and humidity from an air conditioning unit to the respective processing units. For example, such an air conditioning unit is arranged immediately above the processing units requiring clean air controlled in temperature and humidity, thereby eliminating ducts hard to arrange and improving supply efficiency for the clean air.

Following the recent increase of the diameter of the substrate, the processing units and the transport robot have also been increased in size, and the footprint (plane area occupied by the apparatus) of the overall substrate processing apparatus also tends to be increased. In view of effective utilization of the space of a clean room requiring a considerable cost for maintaining environment, it is necessary to suppress increase of the footprint of each substrate processing apparatus to the minimum, and a countermeasure of vertically stacking the processing units in multiple stages is studied for this purpose.

If the air conditioning unit is arranged immediately above the processing units vertically stacked in multiple stages, however, the height of the overall apparatus is excessively increased. On the other hand, each process following pattern refinement increasingly requires strict quality control, and it is necessary to completely control the temperature and humidity of the air supplied to the processing units, particularly the coating processing unit or the like whose processing result is remarkably influenced by the atmosphere.

SUMMARY OF THE INVENTION

The present invention is directed to a substrate processing apparatus comprising $n$ (n: natural number of at least two) processing parts processing a substrate.

According to the present invention, the substrate processing apparatus comprises a temperature-controlled air supply part adjusting the temperature of air and delivering the temperature-controlled air, a manifold formed by branching a common pipe into $n$ distributing pipes for communicatively connecting the common pipe to the temperature-controlled air supply part while communicatively connecting the $n$ distributing pipes to the $n$ processing parts in one-to-one correspondence and $n$ correction temperature control parts provided in one-to-one correspondence to the $n$ distributing pipes for temperature-controlling air passing through the distributing pipes.

The correction temperature control part can supply temperature-controlled air to the processing parts with sufficient accuracy while it follows that the manifold distributes the air delivered from the temperature-controlled air supply part and supplies the same to the processing parts, whereby the height of the overall apparatus can be inhibited from remarkable increase also when vertically stacking the processing parts in multiple stages.

Preferably, the substrate processing apparatus further comprises a first temperature measuring element provided on the common pipe for measuring the temperature of air passing through the common pipe and $n$ second temperature measuring elements provided in one-to-one correspondence to the $n$ distributing pipes for measuring the temperature of air passing through the distributing pipes, while the temperature-controlled air supply part performs temperature control one the basis of a result of measurement of the first temperature measuring element to set the air passing through the common pipe to a first target temperature and each of the $n$ correction temperature control parts performs temperature control on the basis of a result of measurement of the second temperature measuring element provided on the distributing pipe corresponding to the correction temperature control part to set the air passing through the distributing pipe to a second target temperature.

Each distributing pipe can efficiently obtain air of the second target temperature.

More preferably, the first temperature measuring element measures the temperature of air passing through a branch point of the manifold, and each of the $n$ second temperature measuring elements measures the temperature of air passing through a joint between the distributing pipe corresponding to the second temperature measuring element and the processing part communicatively connected with the distributing pipe.

The substrate processing apparatus can perform temperature control in consideration of disturbance of the common pipe and the distributing pipes, thereby stably supplying temperature-controlled air to the processing parts with sufficient accuracy.

Accordingly, an object of the present invention is to provide a substrate processing apparatus capable of inhibiting the height of the overall apparatus from remarkable increase also when vertically stacking processing parts in multiple stages and supplying temperature-controlled air to the processing parts with sufficient accuracy.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described in detail with reference to the drawings.

Figure 1:
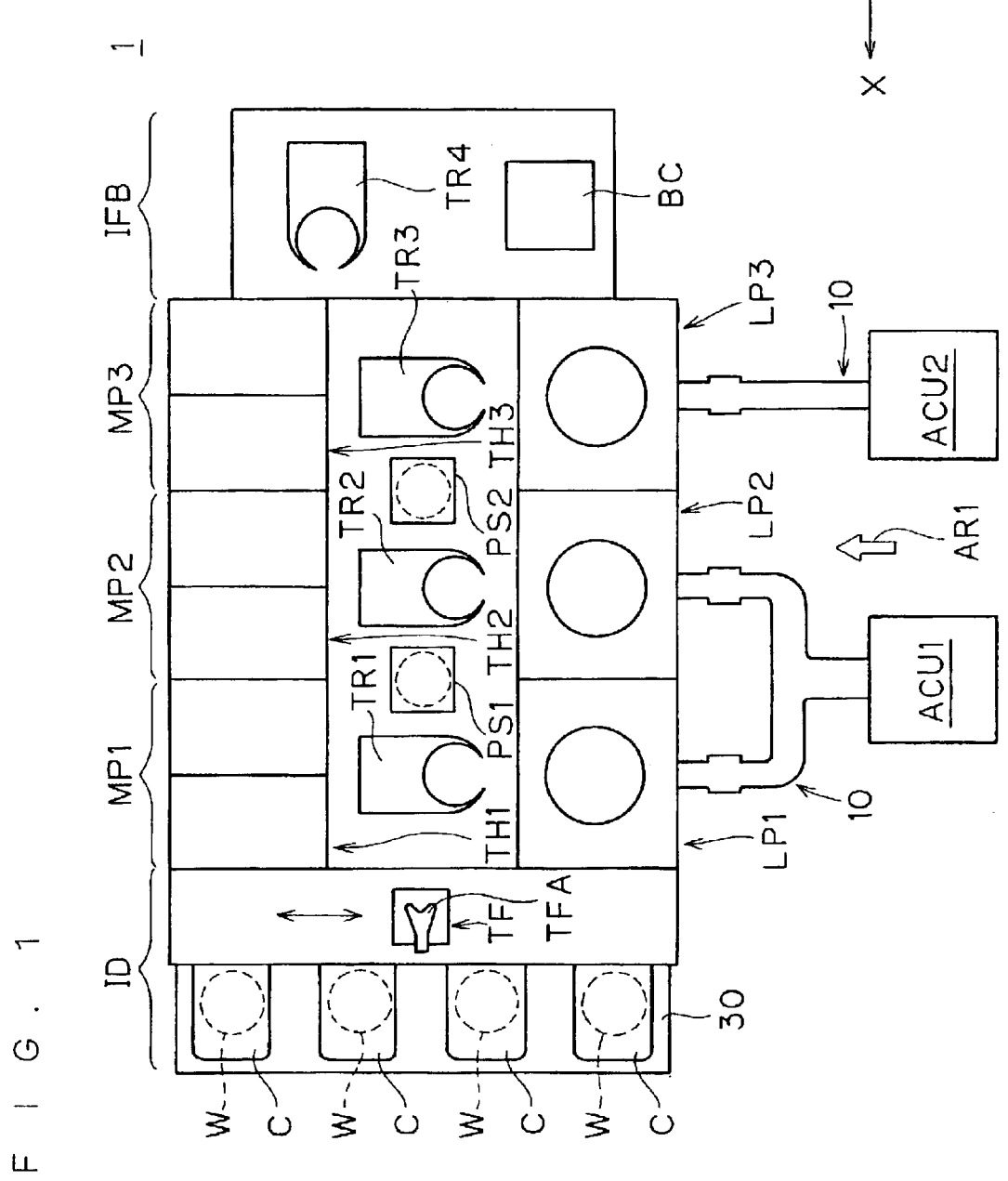
FIG. 1 is a plan view showing the overall structure of a substrate processing apparatus according to an embodiment of the present invention.

FIG. 1 is a plan view showing the overall structure of a substrate processing apparatus 1 according to the embodiment of the present invention. FIGS. 1 to 4 and 6 are provided with an XYZ Cartesian coordinate system having a vertical Z-axis direction and a horizontal X-Y plane at need, in order to clarify directional relation.

The substrate processing apparatus 1 is the so-called coater & developer performing resist coating processing and development processing on a substrate W, and generally formed by an indexer ID, three unit arrangement parts MP1, MP2 and MP3 and an interface IFB.

The indexer ID comprises a transfer robot TF and a placement stage 30. Four carriers C can be horizontally arranged and placed on the placement stage 30 along the Y-axis direction. Each carrier C has multistage storing grooves, each of which can horizontally store a single substrate W with the main surface along a horizontal plane. Therefore, each carrier C can horizontally store a plurality of (e.g., 25) substrates W in a state stacked at prescribed intervals in a multistage manner. The carrier C may be formed by either a FOUP (front opening unified pod) or an SMIF (standard mechanical interface) pod storing the substrates W in a closed space or an OC (open cassette) exposing the stored substrates W to the outside air.

The transfer robot TF comprises a transfer arm TFA, and can vertically move, rotate and horizontally reciprocate the transfer arm TFA. The transfer robot TF itself moves along the direction Y thereby horizontally moving the transfer arm TFA along the Y-axis direction. In other words, the transfer robot TF can three-dimensionally move the transfer arm TFA. Due to such operations of the transfer robot TF, the indexer ID can take out an unprocessed substrate W from any carrier C capable of storing a plurality of substrates W and transfer the same to the unit arrangement part MP1 while receiving a processed substrate W from the unit arrangement part MP1 and storing the same in the carrier C.

The unit arrangement parts MP1, MP2 and MP3 are adjacently arranged along the X-axis direction in this order. In other words, the unit arrangement part MP1 is arranged adjacently to the indexer ID, the unit arrangement part MP2 is arranged between the unit arrangement parts MP1 and MP3, and the interface IFB is arranged adjacently to the unit arrangement part MP3.

The unit arrangement part MP1 is formed by oppositely arranging a thermal processing part group TH1 and a liquid processing part group LP1 through a transport robot TR1. Similarly, the unit arrangement part MP2 is formed by oppositely arranging a thermal processing part group TH2 and a liquid processing part group LP2 through a transport robot TR2, and the unit arrangement part MP3 is formed by oppositely arranging a thermal processing part group TH3 and a liquid processing part group LP3 through a transport robot TR3.

Figure 2:
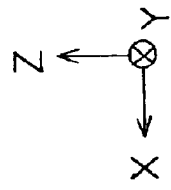
FIG. 2 is a side elevational view of liquid processing part groups shown in FIG. 1.

FIG. 2 is a side elevational view of the liquid processing part groups LP1, LP2 and LP3 as viewed along arrow AR1 in FIG. 1. As shown in FIG. 2, the liquid processing part group LP1 is formed by stacking/arranging three stages of coating processing units SC3, SC2 and SC1 in ascending order. Each of the coating processing units SC1, SC2 and SC3 is a kind of the so-called spin coater foundation-coating the substrate W with photoresist while rotating the same.

The liquid processing part group LP2 is formed by stacking/arranging three stages of coating processing units SC6, SC5 and SC4 in ascending order. Each of the coating processing units SC4, SC5 and SC6 is also a kind of the so-called spin coater coating the substrate W with photoresist while rotating the same.

The liquid processing part group LP3 is formed by stacking/arranging five stages of development processing units SD5, SD4, SD3, SD2 and SD1 in ascending order. Each of the development processing units SD1, SD2, SD3, SD4 and SD5 is the so-called spin developer developing an exposed substrate W by supplying a developer thereto.

Throughout the specification, the coating processing units SC1 to SC6 and the development processing units SD1 to SD5 supplying processing liquids such as the photoresist and the developer to the substrate W respectively are referred to as "liquid processing units". Therefore, it can be said that each of the liquid processing part groups LP1, LP2 and LP3 is a processing part group formed by stacking/arranging liquid processing units in multiple stages along the vertical direction.

Figure 3:
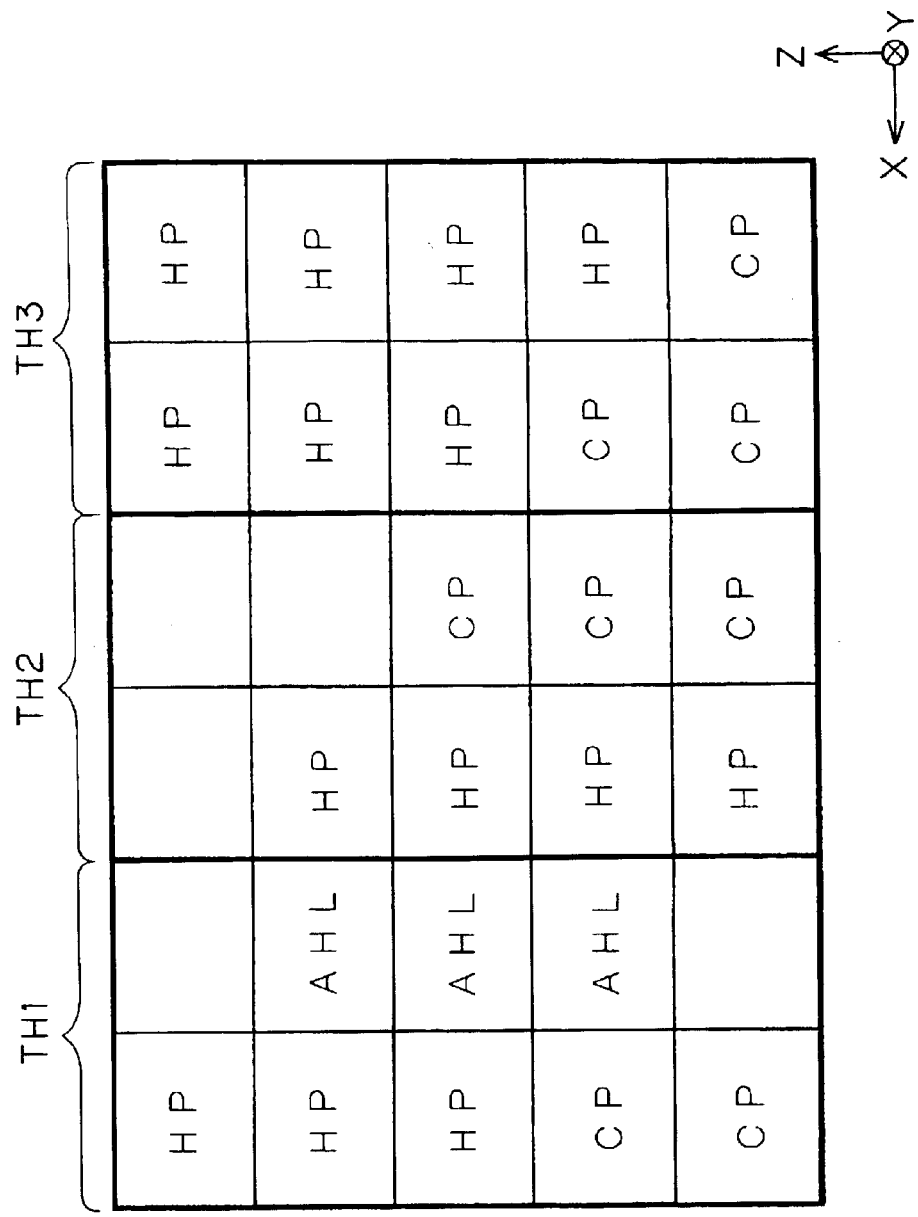
FIG. 3 is a side elevational view of thermal processing part groups shown in FIG. 1.

FIG. 3 is a side elevational view of the thermal processing part groups TH1, TH2 and TH3 as viewed along arrow AR1 in FIG. 1. The thermal processing part group TH1 is formed by adjacently arranging a thermal processing part series obtained by stacking/arranging five stages of cooling units CP and heating units HP in ascending order and another thermal processing part series obtained by stacking/arranging three stages of heating units AHL in ascending order along the X-axis direction. Each heating unit HP is the so-called hot plate heating the substrate W to a prescribed temperature. Each cooling unit CP is the so-called cool plate cooling the substrate W to a prescribed temperature and maintaining the substrate W at the prescribed temperature. Each heating unit AHL, also a kind of the so-called hot plate similar to the heating unit HP, performs heating for reinforcing adherence before resist coating processing in particular.

The thermal processing part group TH2 is formed by adjacently arranging a thermal processing part series obtained by stacking/arranging four stages of heating units HP in ascending order and another thermal processing part series obtained by stacking/arranging three stages of cooling units CP in ascending order along the X-axis direction. The heating units HP of the thermal processing part group TH2 include a unit performing the so-called pre-exposure prebaking.

The thermal processing part group TH3 is formed by adjacently arranging a thermal processing part series obtained by stacking/arranging five stages of cooling units CP and heating units HP in ascending order and another thermal processing part series formed by stacking/arranging five stages of a cooling unit CP and heating units HP in ascending order along the X-axis direction. The heating units HP of the thermal processing part group TH3 include a unit performing the so-called post-exposure prebaking.

Throughout the specification, the heating units HP and AHL and, the cooling units CP controlling the temperature of the substrate W are referred to as "thermal processing units". Throughout the specification, further, the liquid processing units and the thermal processing units are generically referred to as "processing units". Therefore, it can be said that each of the thermal processing part groups TH1, TH2 and TH3 is a processing part group formed by stacking/arranging thermal processing units in multiple stages along the vertical direction.

The arrangement structure of the liquid processing units shown in FIG. 2 and that of the thermal processing units shown in FIG. 3 are mere examples, and various modifications are available so far as the processing units are stacked in multiple stages for forming processing part groups. In particular, blank portions in FIG. 3, which are preliminary positions for thermal processing units, may be left as vacant positions, or heating units HP or cooling units CP may be set on the blank portions.

Referring again to FIG. 1, each of the transport robots TR1, TR2 and TR3 comprises two transport arms, and can vertically move the same, rotate the same in a horizontal plane and reciprocate the same in a horizontal plane. However, not the overall transport robots TR1, TR2 and TR3 travel along the horizontal direction. The transport robot TR1 of the unit arrangement part MP1 exclusively transports the substrate W between the processing units included in the thermal processing part group TH1 and the liquid processing part group LP1. The transport robot TR1 further transfers/receives the substrate W to/from the transfer robot TF of the indexer ID, and transfers/receives the substrate W to/from a delivery stand PS1. The delivery stand PS1, which is a substrate receiving stand provided between the unit arrangement parts MP1 and MP2, more correctly provided between the transport robots TR1 and TR2, is employed for transferring the substrate W between the transport robots TR1 and TR2.

The transport robot TR2 of the unit arrangement part MP2 exclusively transports the substrate W between the processing units included in the thermal processing part group TH2 and the liquid processing part group LP2. The transport robot TR2 further transfers/receives the substrate W to/from the delivery stand PS1 and another delivery stand PS2. The delivery stand PS2, which is a substrate receiving stand provided between the unit arrangement parts MP2 and MP3, more correctly provided between the transport robots TR2 and TR3, is employed for transferring the substrate W between the transport robots TR2 and TR3.

Similarly, the transport robot TR3 of the unit arrangement part MP3 exclusively transports the substrate W between the processing units included in the thermal processing part group TH3 and the liquid processing part group LP3. The transport robot TR3 further transfers/receives the substrate W to/from a transport robot TR4 of the interface IFB described later, and transfers/receives the substrate W to/from the delivery stand PS2.

The interface IFB, provided adjacently to the unit arrangement part MP3 and also adjacent to an exposure apparatus (not shown), comprises the transport robot TR4 and a buffer cassette BC. The transport robot TR4 of the interface IFB has a function of receiving the substrate W coated with resist from the transport robot TR3 and transferring the same to the exposure apparatus (not shown) while receiving an exposed substrate W from the exposure apparatus and transferring the same to the transport robot TR3. The transport robot TR4 may temporarily store unexposed and exposed substrates W in the buffer cassette BC in order to adjust displacement of substrate transfer timing resulting from difference between processing times in the substrate processing apparatus 1 and the exposure apparatus.

In the substrate processing apparatus 1 having the aforementioned structure, the transfer robot TF of the indexer ID takes out an unprocessed substrate W from any carrier C and transfers the same to the transport robot TR1 of the unit arrangement part MP1. In the unit arrangement part MP1, the transport robot TR1 cyclically transports the substrate W between the processing units included in the thermal processing part group TH1 and the liquid processing part group LP1 thereby foundation-coating the substrate W with resist and performing subsequent thermal processing. The transport robot TR1 transfers the substrate W foundation-coated with resist from the unit arrangement part MP1 to the unit arrangement part MP2 through the delivery stand PS1.

In the unit arrangement part MP2, the transport robot TR2 cyclically transports the substrate W between the processing units included in the thermal processing part group TH2 and the liquid processing part group LP2 thereby coating the substrate W with resist and performing subsequent thermal processing. The transport robot TR2 transfers the substrate W coated with resist from the unit arrangement part MP2 to the unit arrangement part MP3 through the delivery stand PS2, so that the transport robot TR3 of the unit arrangement part MP3 transfers the substrate W to the transport robot TR4 of the interface IFB. The transport robot TR4 transfers the received substrate W coated with resist to the exposure apparatus. The exposure apparatus exposes the substrate W with a pattern.

The exposure apparatus transfers the exposed substrate W to the transport robot TR4 of the interface IFB, which in turn transfers the substrate W to the transport robot TR3 of the unit arrangement part MP3. In the unit arrangement part MP3, the transport robot TR3 cyclically transports the substrate W between the processing units included in the thermal processing part group TH3 and the liquid processing part group LP3, thereby developing the exposed substrate W and performing subsequent thermal processing. The transport robot TR3 returns the developed substrate W to the transfer robot TF of the indexer ID through the transport robots TR2 and TR1. The transfer robot TF stores the substrate W in the carrier C as a processed substrate. Thus, the substrate processing apparatus 1 performs a series of photolithographic processing.

The substrate processing apparatus 1 must supply at least temperature-controlled clean air to the processing units, particularly to the liquid processing units whose processing results are remarkably influenced by the atmosphere. The substrate processing apparatus 1 according to this embodiment is provided with 11 processing units which must be supplied with at least temperature-controlled clean air. In particular, the substrate processing apparatus 1 must supply clean air controlled in temperature and humidity to the coating processing units SC1 to SC6 in which the thickness of a formed resist film varies with the temperature and humidity of the atmosphere. The substrate processing apparatus 1 may not supply temperature-controlled clean air to the thermal processing units included in the thermal processing part groups TH1, TH and TH3 since these thermal processing units perform individual temperature control respectively. It is assumed that the term "humidity" denotes relative humidity throughout the specification.

In order to supply at least temperature-controlled clean air to the liquid processing units, the substrate processing apparatus 1 according to this embodiment is provided with air conditioning units ACU1 and ACU2. The air conditioning unit ACU1 supplies clean air controlled in temperature and humidity to the coating processing units SC1 to SC6, while the air conditioning unit ACU2 supplies temperature-controlled clean air to the development processing units SD1 to SD5. The air conditioning unit ACU1 and the coating processing units SC1 to SC6 are communicatively connected with each other through a manifold 10. The air conditioning unit ACU2 and the development processing units SD1 to SD5 are also communicatively connected with each other through the manifold 10. In other words, the air conditioning unit ACU1 is arranged in common with respect to the liquid processing part groups LP1 and LP2, and the air conditioning unit ACU2 is solely arranged with respect to the liquid processing part group LP3.

Figure 4:
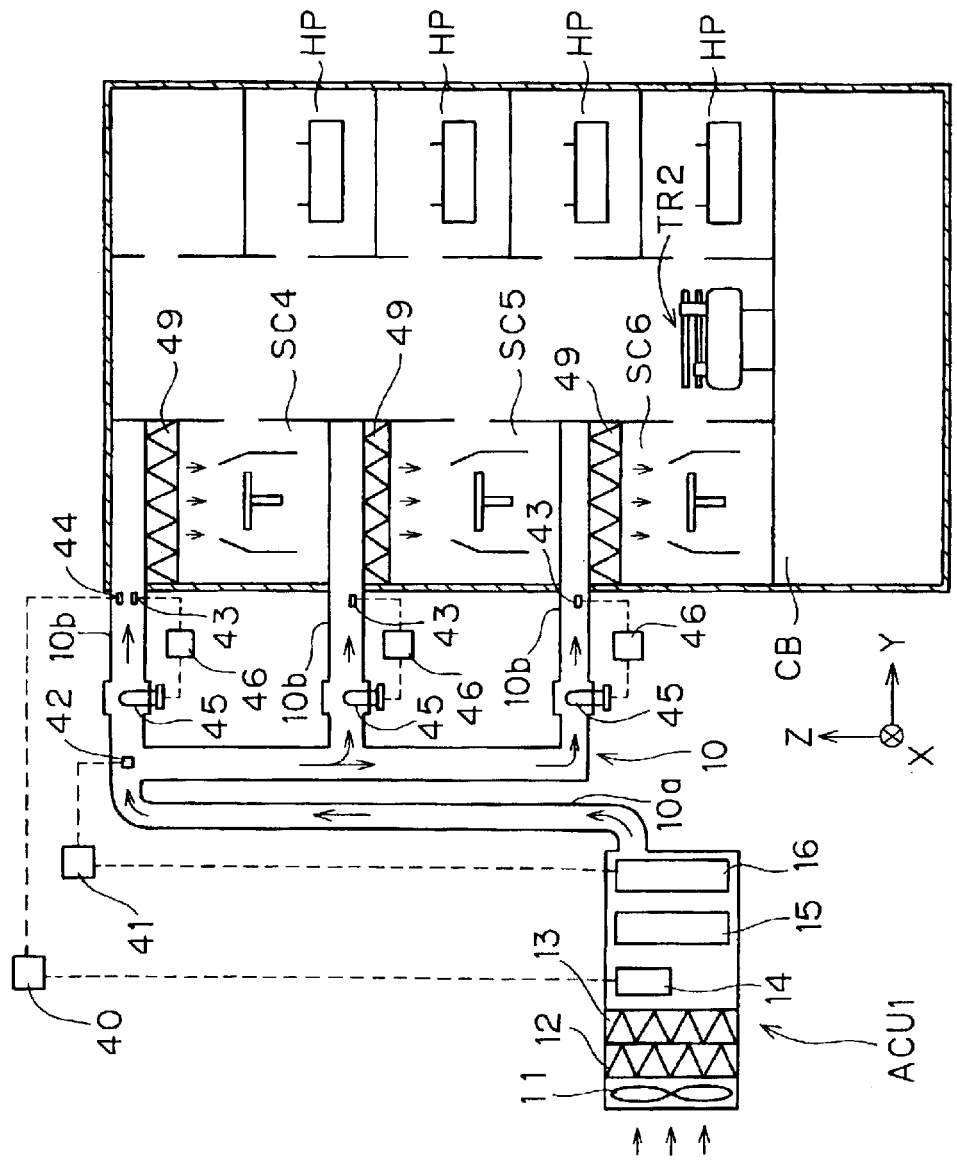
FIG. 4 conceptually illustrates an air conditioning unit supplying clean air controlled in temperature and humidity to coating processing units.

FIG. 4 conceptually illustrates the air conditioning unit ACU1 supplying clean air controlled in temperature and humidity to the coating processing units SC4 to SC6. As described above, the liquid processing part group LP2 formed by stacking/arranging the coating processing units SC4 to SC6 in multiple stages and the thermal processing part group TH2 formed by stacking/arranging the thermal processing units in multiple stages are oppositely arranged through the transport robot TR2. A space located under the liquid processing part group LP2, the thermal processing part group TH2 and the transport robot TR2 serves as a chemical cabinet CB storing pipes etc. for supplying the processing liquids to the liquid processing units.

The air conditioning unit ACU1 arranges and stores a fan 11, a primary chemisorption filter 12, a secondary chemisorption filter 13, a humidifier 14, a refrigerator 15 and a primary heater 16 in this order from an air intake toward the manifold 10. The fan 11 introduces air (generally air in a clean room) from outside the apparatus 1 and feeds the same into the air conditioning unit ACU1. The primary and secondary chemisorption filters 12 and 13 adsorb and remove alkaline substances, mainly ammonia gas, from the air introduced by the fan 11. The fan 11 may alternatively be provided between the primary and secondary chemisorption filters 12 and 13. The humidifier 14, the refrigerator 15 and the primary heater 16 humidifies, cools and heats the air passing through the air conditioning unit ACU1 respectively. The humidifier 14, the refrigerator 15 and the primary heater 16 may be formed by various well-known apparatuses such as a steaming humidifier, an electric heater and the like. According to this structure, the air conditioning unit ACU1 controls the temperature and humidity of the air and feeds the air controlled in temperature and humidity to the manifold 10.

The manifold 10 communicatively connects the air conditioning unit ACU1 with the coating processing units SC1 to SC6. The manifold 10 is formed by branching a common pipe 10a into six distributing pipes 10b. The common pipe 10a is communicatively connected to the air conditioning unit ACU1. The six distributing pipes 10b are communicatively connected to the six coating processing units SC1 to SC6 in one-to-one correspondence. The air controlled in temperature and humidity fed from the air conditioning unit ACU1 to the manifold 10 is distributed to the six distributing pipes 10b and supplied to the coating processing units SC1 to SC6 respectively. The manifold 10 may be partially arranged in the substrate processing apparatus 1 or entirely arranged outside the substrate processing apparatus 1 so far as the same communicatively connects the air conditioning unit ACU1 and the coating processing units SC1 to SC6 with each other.

Each of the six distributing pipes 10b is provided with a secondary heater 45. The secondary heater 45, formed by an electric heater, for example, heats air passing through the distributing pipe 10b provided with this secondary heater 45. In other words, the air fed from the air conditioning unit ACU1 to the common pipe 10a of the manifold 10 and distributed to the six distributing pipes 10b is further heated by the secondary heaters 45 and supplied to the coating processing units SC1 to SC6 respectively.

A branch point of the manifold 10, i.e., the joint between the common pipe 10a and the six distributing pipes 10b, is provided with a first temperature sensor 42 measuring the temperature of the air passing therethrough. Further, the joints between the six distributing pipes 10b and the coating processing units SC1 to SC6 corresponding thereto are provided with second temperature sensors 43 measuring the temperature of the air passing therethrough. In addition, the joint between any of the six distributing pipes 10b and the coating processing unit (SC4 in FIG. 4) corresponding to this distributing pipe 10b is provided with a humidity sensor 44 measuring the humidity of the air passing therethrough. The substrate processing apparatus 1 is provided with a first temperature controller 41, six second temperature controllers 46 and a humidity controller 40. The controllers 41, 46 and 40, which are separated from the substrate processing apparatus 1 in FIG. 4 for convenience of illustration, may be provided on the body of the substrate processing apparatus 1 or in the air conditioning unit ACU1.

The first temperature controller 41 is electrically connected with the first temperature sensor 42 and the primary heater 16 for feedback-controlling the primary heater 16 on the basis of a result of measurement of the first temperature sensor 42. In other words, the first temperature control sensor 41 controls the primary heater 16 to set the air passing through the branch point of the manifold 10 to a predetermined temperature.

Each second temperature controller 46 is electrically connected with the second temperature sensor 43 and the secondary heater 45 provided on the distributing pipe 10b corresponding to the second temperature controller 46 for feedback-controlling the secondary heater 45 on the basis of a result of measurement of the second temperature sensor 43. In other words, the second temperature controller 46 controls the secondary heater 45 to set the air passing through the joint between the distributing pipe 10b corresponding to this secondary temperature controller 46 and the coating processing unit communicatively connected with the distributing pipe 10b to a predetermined temperature.

The temperature controller 40 is electrically connected with the humidity sensor 44 and the humidifier 14, for controlling the humidifier 14 on the basis of a result of measurement of the humidity sensor 44.

Figure 5:
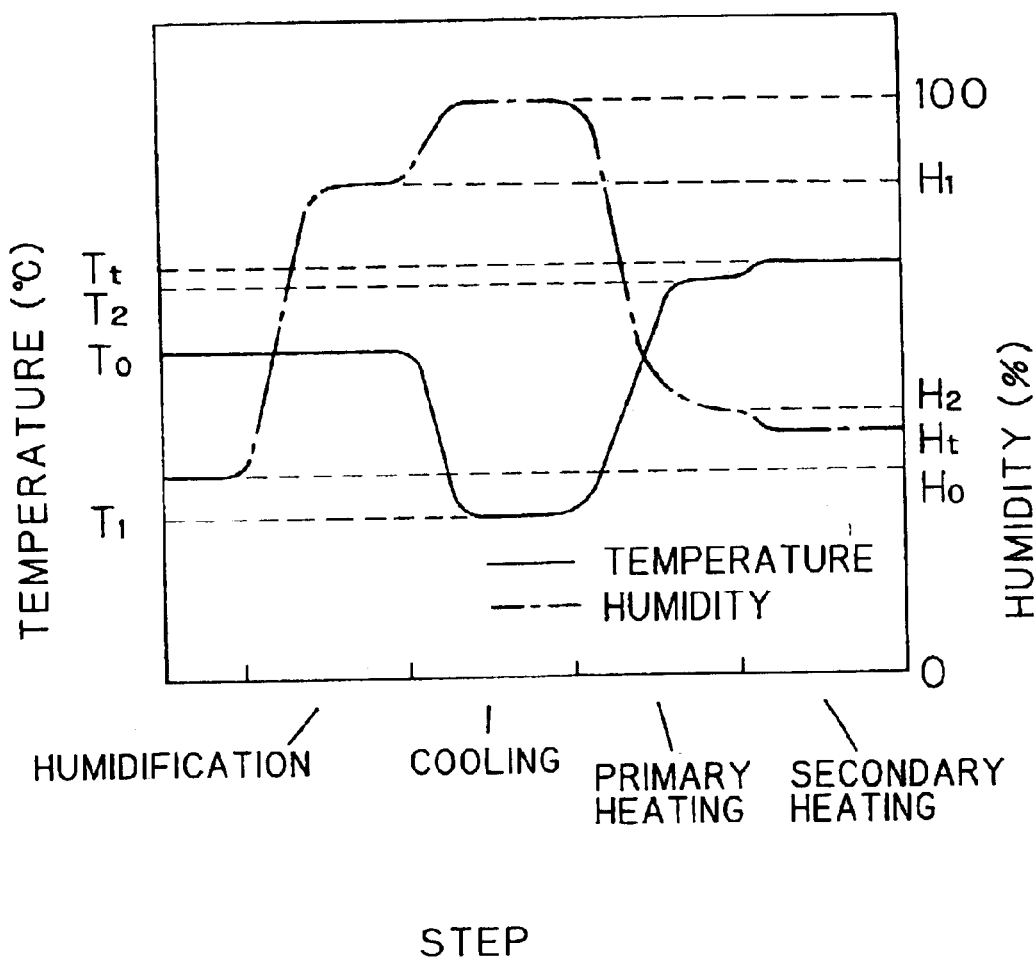
FIG. 5 illustrates an exemplary mode of controlling the temperature and humidity of air in the substrate processing apparatus.

An exemplary mode of controlling the temperature and humidity of the air supplied from the air conditioning unit ACU1 to the coating processing units SC1 to SC6 through the manifold 10 is now described. FIG. 5 illustrates the exemplary mode of controlling the temperature and humidity of the air in the substrate processing apparatus 1. Referring to FIG. 5, a solid line shows the temperature, and a one-dot chain line shows the humidity.

It is assumed that $T_0$ and $H_0$ represent the initial temperature and the initial humidity of the air introduced by the air conditioning unit ACU1 respectively. It is also assumed that Tt and Ht represent a target temperature (second target temperature) and target humidity of the air required in any processing unit, e.g., the coating processing unit SC4, respectively.

The humidifier 14 humidifies the air introduced into the air conditioning unit ACU1. In this humidification step, the temperature of the introduced air remains substantially unchanged, while the humidity thereof is increased to a level $H_1$. At this time, the humidity level $H_1$ may be in excess of a value bringing the humidity to 100% (causing dew formation) in a subsequent cooling step.

After the humidification step, the refrigerator 15 cools the air passing through the humidifier 14 to a temperature level $T_1$. This temperature level $T_1$ corresponds to a dew point of air comprising the conditions of the target temperature Tt and the target humidity Ht in the coating processing unit SC4. The humidity of the air cooled to the temperature level $T_1$ reaches 100%, and excess moisture is condensed and removed from the air as liquid-phase water. In subsequent steps, the absolute quantity of moisture contained in the air supplied from the air conditioning unit ACU1 to the coating processing unit SC4 remains unchanged, while the humidity varies with the temperature of the air and reaches the level Ht when the temperature reaches the level Tt.

After the cooling step, the air passing through the refrigerator 15 reaches the primary heater 16, which in turn carries out a primary heating step. In this primary heating step, the primary heater 16 heats the air to a temperature level $T_2$ (first target temperature). The first temperature controller 41 controls the primary heater 16 on the basis of a detection signal from the first temperature sensor 42 provided on the branch point of the manifold 10. Therefore, the primary heater 16 performs primary heating, so that the air passing through the branch point of the manifold 10 reaches the temperature level $T_2$. Consequently, the humidity of the air passing through the branch point of the manifold 10 is reduced to a level $H_2$. The temperature level $T_2$ is set slightly lower by 0.2° C., for example, than the target temperature Tt.

After the primary heating step, the air conditioning unit ACU1 feeds the air passing through the primary heater 16 to the common pipe 10a of the manifold 10, which in turn distributes the air to the six distributing pipes 10b. The air passing through the branch point of the manifold 10 is at the temperature level $T_2$ and the humidity level $H_2$. Each secondary heater 45 heats the air flowing into each distributing pipe 10b of the manifold 10. In this secondary heating step, the secondary heater 45 heats the air to the target temperature Tt. The second temperature controller 46 controls the secondary heater 45 on the basis of a detection signal from the second temperature sensor 43 provided on the joint between the distribution pipe 10b provided with tis secondary heater 45 and the processing unit (the coating processing unit SC4 in this case) communicatively connected with the distribution pipe 10b. Therefore, the secondary, heater 45 performs secondary heating, so that the air passing through the joint between the distribution pipe 10b and the aforementioned processing unit, i.e., an air supply port of the coating processing unit SC4 reaches the target temperature Tt. Consequently, the humidity of the air passing through the aforementioned joint is reduced to the target level Ht.

The air completely controlled in temperature and humidity passing through the joint between the distribution pipe 10b and the processing unit SC4 further passes through a filter 49 provided on this processing unit, forms a down flow in this processing unit and is supplied to a portion around a spin head. The filter 49 for removing particles may be formed by a HEPA filter, for example.

Thus, the air conditioning unit ACU1 controls the temperature of the air to a level slightly lower than the target temperature Tt and the secondary heaters 45 perform fine control (correction) for setting the air to the target temperature Tt and supplying the same to the processing units. The primary heater 16 of the air conditioning unit ACU1 heats the air on the basis of the result of measurement of the first temperature sensor 42 provided on the branch point of the manifold 10, whereby the air conditioning unit ACU1 can temperature-control the air in consideration of disturbance in the common pipe 10a. The secondary heater 45 heats the air on the basis of the result of measurement of the second temperature sensor 43 provided on the joint between the distributing pipe 10b and the processing unit SC4, whereby the thermal processing unit 1 can temperature-control the air in consideration of disturbance in the distributing pipe 10b. In other words, the thermal processing unit 1 temperature-controls the air so that the air passing through air supply ports of the processing units reaches the target temperature Tt, to be capable of supplying temperature-controlled air to the processing units with sufficient accuracy.

When cooling the air sufficiently increased in humidity to all temperature corresponding to the dew point of the air comprising conditions of the target temperature Tt and the target humidity Ht in the processing units in the aforementioned cooling step, the substrate processing apparatus 1 condenses/removes excess moisture, fixes the absolute quantity of moisture contained in the air and automatically attains the target humidity Ht by correctly temperature-controlling the air passing through the air supply ports of the processing units to the target temperature Tt. According to this embodiment, however, the humidity sensor 44 is provided on the joint between each distributing pipe 10b and each processing unit, to be capable of performing correction setting the humidity of the air passing through the joint to the target level Ht on the basis of the result of measurement thereof. More specifically, the substrate processing apparatus 1 increases the quantity of humidification with the humidifier 14 or the cooling temperature of the refrigerator 15 if the result of measurement of the humidity sensor 44 is lower than the target humidity Ht, for example. If the result of measurement of the humidity sensor 44 is higher than the target humidity Ht, the substrate processing apparatus 1 may reduce the cooling temperature of the refrigerator 15.

The air conditioning unit ACU1 distributes/supplies temperature-controlled air to the processing units through the manifold 10, whereby the height of the overall apparatus 1 can be inhibited from remarkable increase also when vertically stacking the processing units in multiple stages, as compared with the case of arranging the air conditioning unit immediately above the processing units as in the prior art.

The secondary heaters 45 are provided on the respective distributing pipes 10b so that the substrate processing apparatus 1 can individually set target temperatures as to the respective ones of the secondary heaters 45. The target temperatures may differ from each other when the coating processing units SC4 and SC5 coat the substrate W with different types of resist materials or thicknesses to be obtained differ from each other, for example. In this case, the substrate processing apparatus 1 can perform desired temperature control every processing unit by individually setting target temperatures as to the respective ones of the secondary heaters 45. In general, it is supposed that the coating processing units SC4, SC5 and SC6 performing resist coating processing require correct control of the temperature and humidity while the temperature and the humidity may be constant in the coating processing units SC1, SC2 and SC3 performing foundation coating.

Figure 6:
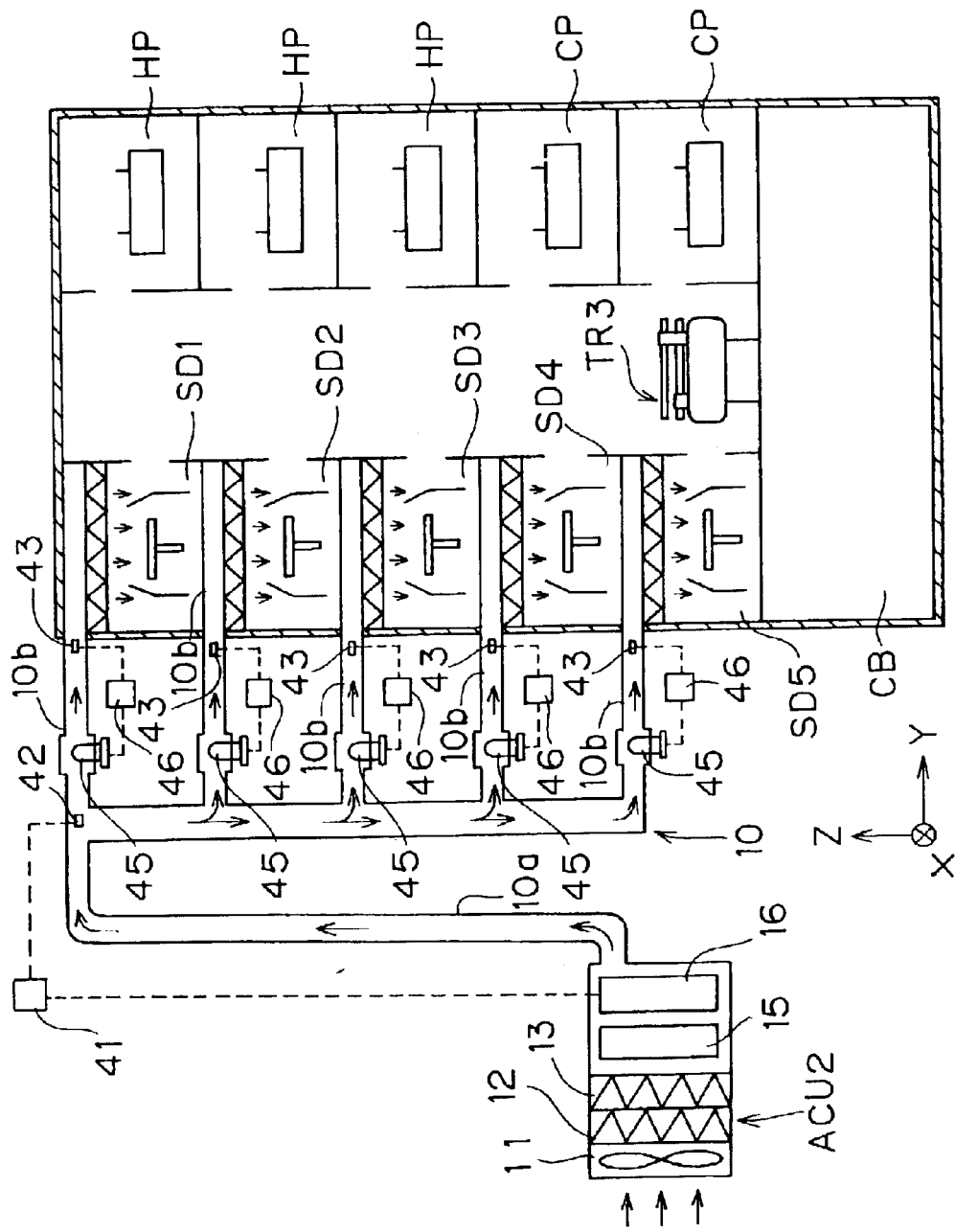
FIG. 6 conceptually illustrates another air conditioning unit supplying temperature-controlled clean air to development processing units.

FIG. 6 conceptually illustrates the air conditioning unit ACU2 supplying temperature-controlled clean air to the development processing units SD1 to SD5. Referring to FIG. 6, structures identical to those in FIG. 4 are denoted by the same reference numerals, to omit redundant description.

The air conditioning unit ACU2 is different from the air conditioning unit ACU1 in a point that the same is provided with no humidifier 14, and the remaining structures of the former are absolutely identical to those of the latter. Following this, the substrate processing apparatus 1 is provided with neither humidity controller 40 nor humidity sensor 44 either.

A manifold 10 communicatively connects the air conditioning unit ACU2 with the development processing units SD1 to SD5. Five distributing pipes 10b of the manifold 10 are provided with secondary heaters 45 respectively. A branch point of the manifold 10 is provided with a first temperature sensor 42, so that a first temperature controller 41 controls a primary heater 16 on the basis of a detection signal from the first temperature sensor 42. Joints between the five distributing pipes 10b and the development processing units SD1 to SD5 corresponding thereto are provided with second temperature sensors 43, so that second temperature controllers 46 control the second heaters 45 on the basis of detection signals from the second temperature sensors 43.

Referring to FIG. 6, only the temperature of air is under the control. In other words, the substrate processing apparatus 1 sets only a target temperature in the development processing units SD1 to SD5 while setting no target humidity. This is because the temperature influences the developing speed while humidity hardly influences development processing.

As a specific temperature control technique, a refrigerator 15 and the primary heater 16 control the temperature of air passing through the branch point of the manifold 10 to a level slightly lower than the target temperature in the development processing units SD1 to SD5. The secondary heaters 45 secondarily heat the air passing through the joints between the distributing pipes 10b and the development processing units SD1 to SD5 to the target temperature. In other words, the substrate processing apparatus 1 performs temperature control similar to that described above except that the same performs no humidity control.

Also in this case, the substrate processing apparatus 1 performs temperature control, so that the air passing through air supply ports of the processing units SD1 to SD5 reaches the target temperature, to be capable of supplying temperature-controlled air to the processing units SD1 to SD5 with sufficient accuracy. Further, the air conditioning unit ACU2 distributes/supplies temperature-controlled air to the processing units SD1 to SD5 through the manifold 10, whereby the height of the overall apparatus 1 can be inhibited from remarkable increase also when vertically stacking the processing units SD1 to SD5 in multiple stages.

While the embodiment of the present invention has been described, the present invention is not restricted to the aforementioned embodiment. For example, the distributing pipes 10b of each manifold 10 may be provided with coolers for cooling the air or humidifiers humidifying the air in place of or in addition to the secondary heaters 45. These perform control based on results of detection of the second temperature sensors 43 and the temperature sensor 44 respectively.

While the common air conditioning unit ACU1 is arranged with respect to the liquid processing part groups LP1 and LP2 in the aforementioned embodiment, individual air conditioning units may alternatively be provided as to the respective ones of the liquid processing part groups LP1 and LP2. In other words, an air conditioning unit may be provided as to the coating processing units SC1 to SC3 while providing another air conditioning unit as to the coating processing units SC4 to SC6.

While the first temperature sensor 42 is provided on the branch point of each manifold 10 and the second temperature sensors 43 are provided on the joints between the distributing pipes 10b and the processing units SC1 to SC4 or SD1 to SD5 in the aforementioned embodiment, the first temperature sensor 42 may be provided on a position capable of measuring the temperature of air passing through the common pipe 10a of the manifold 10, and the second temperature sensors 43 may be provided on positions capable of measuring the temperature of air passing through the distributing pipes 10b of the manifold 10. However, accuracy of temperature control can be more improved when structuring the first and second temperature sensors 42 and 43 as in the aforementioned embodiment.

The substrate processing apparatus according to the present, invention is applicable not only to an apparatus processing a semiconductor substrate but also to an apparatus comprising a plurality of processing parts processing a glass substrate for a liquid crystal display, a glass substrate for a photomask, a substrate for an optical disk or the like.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus comprising $n$ (n: natural number of at least two) processing parts processing a substrate, comprising:

a temperature-controlled air supply part adjusting the temperature of air and delivering said temperature-controlled air;

a manifold formed by branching a common pipe into $n$ distributing pipes for communicatively connecting said common pipe to said temperature-controlled air supply part while communicatively connecting said $n$ distributing pipes to said $n$ processing parts in one-to-one correspondence; and $n$ correction temperature control parts provided in one-to-one correspondence to said $n$ distributing pipes for temperature-controlling air passing through said distributing pipes.

2. The substrate processing apparatus according to claim 1, further comprising:

a first temperature measuring element provided on said common pipe for measuring the temperature of air passing through said common pipe, and n second temperature measuring elements provided in one-to-one correspondence to said n distributing pipes for measuring the temperature of air passing through said distributing pipes, wherein said temperature-controlled air supply part performs temperature control on the basis of a result of measurement of said first temperature measuring element to set air passing through said common pipe to a first target temperature, and each of said n correction temperature control parts performs temperature control on the basis of a result of measurement of said second temperature measuring element provided on said distributing pipe corresponding to said correction temperature control part to set air passing through said distributing pipe to a second target temperature.

3. The substrate processing apparatus according to claim 2, wherein said first temperature measuring element measures the temperature of air passing through a branch point of said manifold, and each of said n second temperature measuring elements measures the temperature of air passing through a joint between said distributing pipe corresponding to said second temperature measuring element and said processing part communicatively connected with said distributing pipe.

4. The substrate processing apparatus according to claim 3, wherein second target temperatures are individually set as to the respective ones of said n correction temperature control parts.

5. The substrate processing apparatus according to claim 3, wherein said temperature-controlled air supply part comprises a primary heating part heating air and a cooling part cooling air, said correction temperature control parts comprise secondary heating parts heating air, and said second target temperature is set higher than said first target temperature.

6. The substrate processing apparatus according to claim 5, further comprising a humidity measuring element measuring the humidity of air passing through a joint between any of said n distributing pipes and said processing part communicatively connected with said distributing pipe, wherein said temperature-controlled air supply part further comprises a humidification part humidifying air and performs temperature control and humidification on the basis of a result of measurement of said humidity measuring element to set air passing through said joint to a target humidity.

7. The substrate processing apparatus according to claim 6, wherein said cooling part cools air humidified by said humidification to a dew point of air comprising the conditions of said second target temperature and said target humidity.

8. The substrate processing apparatus according to claim 6, wherein said processing parts are coating processing parts coating a substrate with resist.

* * * * *